United States Patent Office 2,823,149
Patented Feb. 11, 1958

2,823,149

PROCESS OF FORMING BARRIER LAYERS IN CRYSTALLINE BODIES

Preston Robinson, Williamstown, Mass., assignor to Sprague Electric Company, North Adams, Mass., a corporation of Massachusetts No Drawing. Application October 27, 1953
Serial No. 388,690

2 Claims. (Cl. 148—1.5)

The present invention relates to a new and improved process for forming so-called barrier layers in single crystals of semiconductive materials, such as, specifically, germanium or silicon.

Prior to the present time, several procedures have been suggested and used for this purpose. One of these consists of the fusing of an element capable of changing the type of conductance of a semiconductive material into a crystalline lattice material by carefully controlling the temperature. Throughout this process a very close temperature control is necessary because it is desired to diffuse the impurity into the crystal sufficiently so that the junction resides at an appreciable distance from the surface of the semiconductor crystal and yet in order to achieve this maximum depth of diffusion the temperature must of necessity be sufficiently high that it approaches the melting point of the alloy of the semiconductor material and the impurity present on the surface of the crystal. Inasmuch as it is undesirable to have localized surface melting during this diffusion process, it is necessary to closely control the temperature of diffusion which introduces difficult production techniques, which techniques are readily susceptible to error.

It is an object of the present invention to develop a new and improved procedure of producing barrier layers within single semiconductive crystals. A further object is to establish a process for this purpose which can easily and conveniently be carried out, and which will overcome many of the defects of the prior art procedures. Further objects of the invention, as well as the advantages of it, will be apparent from this specification and the appended claims.

Briefly, the invention consists of series of steps in treating a crystalline body of either p or n conductance so as to change the type of conductance of a very small region of this body. First, a single crystal in which a barrier layer is to be placed is treated so as to form what is termed a "quasi barrier" layer. Then, the impurity to be diffused into the crystal is deposited upon this layer as by electroplating or thermal deposition, and finally, the impurity is caused to diffuse into the positive crystalline body through the quasi barrier layer, this layer serving to control the speed of diffusion of the impurity element. If desired, the quasi barrier layer used with the invention can be removed from the semiconductive crystal either during the diffusion of the second component or during treatment of the host material following the formation of the p–n barrier junction. Thus the semiconductor is separated from an impurity metal by a barrier which may be a compound, an interstitial alloy of the semiconductor, or a foreign film. This barrier is chosen such that the impurity metal diffuses through the barrier slower than through the semiconductor. Hence no low melting alloy can accumulate between the barrier and the semiconductor since the impurity is removed from the region of the barrier at a faster rate by diffusion into the semiconductor than it is supplied by diffusion through the barrier. It is thus seen that appreciably higher temperatures can be utilized to diffuse the impurity into the semiconductive crystal than was previously possible, thus allowing the formation of junctions at appreciable distances below the surface of the semiconductive crystal, and this more rapid diffusion is thus made possible without the previously inherent danger of forming a low melting alloy with the semiconducting material and undesired localized surface melting.

One type of quasi barrier layer used to control the diffusion of the present invention consists primarily of an adherent oxide film. This film can be composed solely of an oxide of the host semiconductive material or may be a mixed oxide of this metal and a second metal deposited upon the surface of the crystal solely for the formation of a quasi barrier layer of a satisfactory thickness. Such a second metal frequently is aluminum which forms a very adherent valve type oxide having comparatively dense, but yet not impervious structure when oxidized. The oxidation used to create this type of barrier layer can be anodic, or can consist of heating the host material under conditions of elevated temperature in an oxygen-containing atmosphere.

A second variety of quasi barrier employed with the invention consists of an interstitial alloy formed upon the surface of a host semiconductive single crystalline body. In effect, such interstitial alloys are interstitial solid solutions in which the small atoms of non-metallic elements, specifically, hydrogen, boron, carbon, or nitrogen occupy positions in the interstices of the host crystalline lattice. Because of the tendency of such elements to expand this lattice, as well as to block the diffusion of larger metal atoms throughout the lattice, these interstitial alloys form very effective quasi barriers.

A third type of quasi barrier used with the invention consists of a substantial alloy layer in which the alloying substituent comes from the same group of the periodic system as the host crystalline material, and further, in which this alloying substituent may be readily removed from the surface by acid or other similar treatment.

As an example, in the formation of an oxide barrier film in accordance with the teachings of the invention, a wafer of a single crystal of germanium approximately 5 mils thick and 10 millimeters square can be oxidized by being heated in air at 750° C. for a period of 10 minutes or such a wafer can have its surface formed into a satisfactory quasi barrier by being anodically oxidized in an aqueous bath saturated with boric acid using an initial current density of 40 amps. per square centimeter to a voltage of 600 volts. Another procedure for forming a satisfactory oxide consists of utilizing a wafer of a single crystal of n-type germanium having the dimensions described above using aluminum as the impurity substituent with both the germanium and the aluminum being oxidized anodically as described above.

A variety of procedures are available to those skilled in the art for forming interstitial alloys upon the surfaces of a single crystalline semiconductor. When the interstitial substituent is gas, such as for example, either hydrogen or nitrogen, it is comparatively simple to heat the host material in an atmosphere of either of these gases. As an example of this, the wafer discussed above can be provided by a satisfactory quasi barrier interstitial solid solution surface by being heated in a nitrogen atmosphere at 850° C. for 20 minutes. Slightly lower temperatures are, in general, used in the formation of hydrogen interstitial solid solutions. As an example of this, a satisfactory barrier can be obtained by heating the same wafer in hydrogen at 600° C. for a period of 10 minutes. It is to be emphasized that with the interstitial solid solution as described herein, no attempt need be made to form a nitride, a hydride, a carbide, or a boride having a stoichiometric composition as the presence or absence of such a composition is effectively immaterial within the broad scope of the inventive concept. Nitrides may also be created by heating the semiconductor in ammonia vapors.

The appropriate boride-containing solid solutions for use with the invention can be created by the reduction of boron tetrachloride with hydrogen at a temperature of 900° C. for a period of one hour at one atmosphere of pressure and in contact with the host material. Various carbides can be obtained by passing aliphatic hydrocarbons, such as for example, methane, ethane, or preferably natural gas mixed together with hydrogen over the surfaces of the metal crystal being converted to a quasi barrier state. As an example of this, the surface of a silicon wafer as described above was converted to silicon carbide by passing equal parts of methane and hydrogen over it at a temperature of 800° C. at a pressure of 1 atmosphere for a period of 1 hour.

The variety of metals which can be used to form substitutional quasi barrier alloys as herein described is quite wide. The alloying substituent must, of course, fit within the crystalline lattice of the host semiconductive metal and must not, in addition, diffuse to any large extent within this crystalline lattice. These conditions are best met when the secondary substituent is lower in the periodic system than the host material. A suitable substituent material for use with germanium and silicon is tin. It is to be understood, however, that other elements, such as for example, zirconium, titanium, lead, or the like, can be used to form substitutional alloys having satisfactory quasi barrier characteristics. A satisfactory substitutional quasi barrier can be created by plating a layer of tin approximately 1 mil thick upon the surface of a wafer of a single crystal of germanium, and heating the so-coated crystal at a temperature of 925° C. for a period of one hour.

At times the advantages of interstitial alloy barriers and of the substitutional barriers can be combined together in practicing the broad teachings of the invention by the vapor phase deposition of interstitial compounds or alloys upon the surface of a single crystal metal. As an example of this, tantalum carbide can be deposited by treating such surfaces with hydrogen, methane, and tantalum chloride at 900° C. for a period of 10 minutes. Similarly, quasi barrier layers of titanium boride can be produced by treating the surfaces of single crystalline surfaces of germanium or silicon with titanium chloride, boron trichloride and hydrogen at 800° C. for ½ hour. Other related reactions which can be used to produce similar quasi barrier layers will at once be apparent to those skilled in the art.

Once a quasi barrier layer as described above has been created, the secondary component which it is desired to diffuse into the host monocrystalline material in order to change conductivity of this material can be readily placed upon the surface of this quasi barrier layer as by dipping within a molten body of this material, or by the application of a comparatively low melting solder containing such an element or by electroplating techniques. Such techniques are well-known to the industry and individually form no part of the instant inventive concept. For purposes of reference only, the article by Saby, entitled "Purified impurity p–n–p junction transistors," on pages 1358 to 1360, volume 40, No. 11, Proceedings of the Institute of Radio Engineers (November 1952) is cited.

Once the material to be diffused in the crystalline structure of the host semiconductor is placed upon a quasi barrier layer as described, the actual diffusion may be carried out at an elevated temperature usually within the range of from 700 to 950° C. without any precise amount of temperature control being required and without danger of the formation of a low melting alloy of the impurity and the host crystalline material. In the prior art diffusion of "acceptor" and "donor" impurity elements into germanium generally was within the range of 200° C. and 700° C. and at temperatures above 800° C. was impossible due to the formation of low melting point alloys and inability to control the rate of impurity diffusion. Furthermore, to obtain controllable diffusion the temperature of diffusion could vary only within a small range of plus or minus one degree centigrade. As an example of this, indium is diffused into germanium at 250° C. in accordance with the prior art. With the present invention no such close temperature control is necessary and much higher temperatures can be used to more rapidly effect the diffusion of the impurity into the crystalline lattice. Thus, a process as herein taught marks a substantial improvement. As an example of this process in forming a p–type layer in n–germanium as indicated in the second preceding paragraph, it is satisfactory to heat a combination of n–type germanium to which there is applied a quasi barrier layer, and then a layer of arsenic to a temperature of 900° C. plus or minus 50° C. for a period of 20 minutes. If indium is used as the secondary component to be diffused into the crystal, approximately the same range of temperatures can be satisfactorily employed. As an example of this, a wafer of n–type silicon in which can be coated a quasi barrier as described above and then provided with an adherent layer of an indium-containing solder (85% lead, 15% indium), and then heated at 1300° C. plus or minus 100° C. for a period of 30 minutes.

If desired, when oxide layers are used as the quasi barriers, these oxides can be thermally reduced by hydrogen during the diffusion process. When this is the case, the degree of the reduction of the oxide in turn tends to govern the speed with which the secondary component diffuses into the crystalline structure of the host semiconductor. As an example of this type of process, a germanium crystal anodically oxidized as described above and provided with an indium solder layer on the oxide can be treated in hydrogen at 950° C. for a period of 5 minutes to the creation of a p–n junction.

The precise heating means employed with the invention are comparatively immaterial. Frequently, it is desirable to employ an induction field arranged so as to melt a secondary component being diffused into the crystalline structure of the first, but not melting the host material. The precise furnaces and the like, generally used, are well-known in the art. If desired, the individual surfaces of the semiconductive crystal, being treated as herein described, may be cleaned by electron bombardment or chemical etching prior to carrying out the process described. Also, the quasi barrier layers described can be removed following diffusion process indicated by the use of electron bombardment or chemical etching. As an example of the latter, concentrated hydrochloric acid can be used to dissolve out the substantional alloying ingredients described above.

As many apparently widely different embodiments of my invention may be made without departing from the spirit and scope hereof, it is to be understood that my invention is not limited to the specific embodiments hereof except as defined in the appended claims.

What is claimed is:

1. A process of producing a barrier layer within a crystalline body of a semiconductive material which comprises oxidizing a surface layer of said semiconductive material to an oxide, depositing an element capable of changing the conductivity of said semiconductive material upon said oxide layer, and thermally causing said element to diffuse through said oxide layer into said body of semiconductive material.

2. A process of producing a barrier layer as defined in claim 1 above wherein said oxide layer is reduced back to the semiconductive material while said element is being diffused through said oxide layer.

(References on following page)

References Cited in the file of this patent

UNITED STATES PATENTS

| | | |
|---|---|---|
| 2,441,603 | Storks et al. | May 18, 1948 |
| 2,555,001 | Ohl | May 29, 1951 |
| 2,597,028 | Pfann | May 20, 1952 |

OTHER REFERENCES

Proceedings of the Institute of Radio Engineers, November 1952, vol. 40, No. 11, pages 1341–1342. Article by Armstrong.